United States Patent
Tang et al.

(10) Patent No.: US 9,614,365 B2
(45) Date of Patent: Apr. 4, 2017

(54) METHOD AND SYSTEM TO PREVENT BUS VOLTAGE SAGGING WHEN AN ORING-FET IN AN N+1 REDUNDANT POWER SUPPLY CONFIGURATION IS FAULTY DURING POWER UP

(71) Applicant: Cisco Technology, Inc., San Jose, CA (US)

(72) Inventors: Weizhong Tang, Austin, TX (US); Sung Kee Baek, San Ramon, CA (US); Craig Zimmerman, Austin, TX (US)

(73) Assignee: Cisco Technology, Inc., San Jose, CA (US)

( * ) Notice: Subject to any disclaimer, the term of this patent is extended or adjusted under 35 U.S.C. 154(b) by 450 days.

(21) Appl. No.: 14/220,905

(22) Filed: Mar. 20, 2014

(65) Prior Publication Data
US 2015/0270700 A1    Sep. 24, 2015

(51) Int. Cl.
| | |
|---|---|
| H02H 7/12 | (2006.01) |
| G06F 1/26 | (2006.01) |
| H04M 19/08 | (2006.01) |
| G06F 11/16 | (2006.01) |

(52) U.S. Cl.
CPC ............. H02H 7/1213 (2013.01); G06F 1/26 (2013.01); G06F 11/16 (2013.01); H04M 19/08 (2013.01)

(58) Field of Classification Search
CPC ....... H02H 7/12; H02H 7/1213; H04M 19/08; G06F 1/26; G06F 11/16
See application file for complete search history.

(56) References Cited

U.S. PATENT DOCUMENTS

| | | | | |
|---|---|---|---|---|
| 4,812,672 A | * | 3/1989 | Cowan | H02J 9/061 307/43 |
| 5,945,816 A | * | 8/1999 | Marusik | G05F 1/56 307/86 |

(Continued)

FOREIGN PATENT DOCUMENTS

WO     2008025490 A2     3/2008

OTHER PUBLICATIONS

International Search Report and Written Opinion for PCT/US2015/020028 mailed Jun. 3, 2015.

*Primary Examiner* — Zeev V Kitov
(74) *Attorney, Agent, or Firm* — Polsinelli LLP

(57) ABSTRACT

A system and method for preventing bus voltage sagging when an Oring-FET in an N+1 redundant power supply configuration is faulty during power up. Each redundant power supply includes an Oring-FET and a voltage comparator. The voltage comparator receives and compares an input voltage and an output voltage of the Oring-FET during power up. In the event input voltage is less than the output voltage, the Oring-FET is deemed to be operating properly and provides output to a communicatively coupled system bus in response to the input voltage reaching a predetermined voltage threshold level. In the event the input voltage is approximately equal to the output voltage, the voltage comparator assists in preventing inrush current from flowing from the communicatively coupled system bus and prevents voltage sagging on the communicatively coupled system bus when another redundant power supply configuration is providing power to the communicatively coupled system bus.

18 Claims, 5 Drawing Sheets

(56) References Cited

U.S. PATENT DOCUMENTS

| | | | |
|---|---|---|---|
| 6,281,724 B1* | 8/2001 | Ellis | G06F 1/263 |
| | | | 307/86 |
| 6,462,434 B1* | 10/2002 | Winick | H02J 1/108 |
| | | | 307/85 |
| 7,379,282 B1 | 5/2008 | Zansky | |
| 7,739,282 B1* | 6/2010 | Smith | H04L 67/22 |
| | | | 707/661 |
| 2012/0293017 A1* | 11/2012 | Lidsky | H02H 3/087 |
| | | | 307/126 |

\* cited by examiner

METHOD AND SYSTEM TO PREVENT BUS VOLTAGE SAGGING WHEN AN ORING-FET IN AN N+1 REDUNDANT POWER SUPPLY CONFIGURATION IS FAULTY DURING POWER UP

TECHNICAL FIELD

The present technology pertains to preventing bus voltage sagging, and more specifically pertains to preventing bus voltage sagging when an Oring-FET in an N+1 redundant power supply configuration is faulty during power start up.

BACKGROUND

Redundant power supplies are becoming more popular. For example, 1+1 or N+1 redundant power supplies for electronic equipment, such as servers and/or telecommunication equipment are becoming more prevalent. A redundant power supply configuration can include two or more power supply configurations. Redundant power supplies can assist in ensuring that the associated electronic equipment can continue to operate if one or more of the power supplies is or becomes unavailable. However, if an Oring-FET of a redundant power supply configuration is faulty, voltage on a system bus in the electronic equipment can be low or sag causing the electronic equipment to experience an undesirable reboot.

Referring to FIG. 1, a simplified block diagram of a basic N+1 redundant power supply configuration in accordance with an exemplary embodiment is illustrated. In FIG. 1, the N+1 redundant power supply configuration 100 comprises three power supply configurations. Each redundant power supply configuration can include a power supply 102, an Oring-FET 104 and an Oring-FET controller 106. The power supply 102 can be communicatively coupled to an Oring-FET 104 with the power supply 102 providing power to the Oring-FET 104. The Oring-FET 104 can isolate the power supply 102 from a communicatively coupled system bus 108. The Oring-FET 104 can serve as a diode to prevent reverse current flowing towards the power supply 102 when the Oring-FET 104 is operating properly. An Oring-FET controller 106 can be communicatively coupled to the Oring-FET 104. The Oring-FET controller 106 can control the communicatively coupled Oring-FET 104 when the Oring-FET 104 is operating properly. In the event that the Oring-FET 104 is faulty, the Oring-FET 104 acts as a short. A shorted Oring-FET 104 can cause a low voltage or voltage sag on the communicatively coupled system bus 108 when the power supply 102 is plugged into the system. In the event, a sufficient voltage sagging of the system bus 108 occurs, the voltage sag can cause an undesirable system reboot.

Referring to FIG. 2, a detailed block diagram of a power supply configuration for a redundant power supply configuration in accordance with an exemplary embodiment is illustrated. As shown, the power supply configuration 200 can include an alternating current (AC) or direct current (DC) power supply 202 which can provide power to an electromagnetic compatibility (EMC) filter 204. The EMC filter 204 can reduce and/or eliminate electromagnetic interference that the electronic device may cause. The EMC filter 204 can pass the filtered power to a pre-regulator 206. The pre-regulator 206 can regulate the voltage of the filtered power. The output of the pre-regulator 206 can pass the regulated power to a main DC/DC converter or main power DC/DC converter 208 and/or to an auxiliary DC/DC converter or auxiliary power DC/DC converter 210. The auxiliary DC/DC converter 210 and an auxiliary power supply 212 can provide housekeeping service during power up, initialization and normal operation. The main DC/DC converter 208 can convert the regulated power from the pre-regulator 206 from a first voltage to a second voltage, different from the first voltage. The output of the DC/DC converter 208 can flow through a filter which can comprise an inductor 214 and capacitor 216. The filter can reduce noise from the voltage of the output of the DC/DC converter 208. The filtered output can flow to an Oring-FET 104. When the Oring-FET 104 is powered and operating properly, the Oring-FET 104 can serve as a low loss diode to pass voltage to the system bus 108. When the Oring-FET 104 is powered and operating properly, the Oring-FET 104 can assist and/or prevent current passing through the Oring-FET 104 from the system bus 108. An Oring-FET controller 106 can control the Oring-FET 104 when the Oring-FET 104 is operating properly.

Problems with such N+1 power supply configurations can arise if an Oring-FET 104 is faulty during power up. Typically, each power supply configuration 200 is powered up one at a time. When one or more power supply configurations 200 are providing power to the system bus 108, if a power supply configuration 200 being powered up has a faulty Oring-FET 104, the Oring-FET 104 would be shorted and current from the communicatively coupled system bus 108 can pass to the uncharged capacitor 216 due to the capacitor 216 no longer being isolated from the system bus 108. This can be referred to as an overcurrent. The overcurrent can cause a low voltage or sagging voltage on the system bus 106 which can cause the electronic equipment to enter an undesirable system reboot. In the event, that the power supply configuration 200 has a faulty Oring-FET 104, the faulty Oring-FET 104 can continue to cause the electronic equipment to enter system reboots when powered up.

BRIEF DESCRIPTION OF THE DRAWINGS

In order to describe the manner in which the above-recited and other advantages and features of the disclosure can be obtained, a more particular description of the principles briefly described above will be rendered by reference to specific embodiments thereof which are illustrated in the appended drawings. Understanding that these drawings depict only exemplary embodiments of the disclosure and are not therefore to be considered to be limiting of its scope, the principles herein are described and explained with additional specificity and detail through the use of the accompanying drawings.

DESCRIPTION OF EXAMPLE EMBODIMENTS

While specific implementations are discussed, it should be understood that this is done for illustration purposes only. A person skilled in the relevant art will recognize that other components and configurations may be used without parting from the spirit and scope of the disclosure.

Overview: The disclosed technology addresses the need in the art for preventing bus voltage sagging during power up when an Oring-FET in an N+1 redundant power supply configuration is faulty. Specifically, the disclosed technology addresses the need in the art for preventing bus voltage sagging when an Oring-FET in an N+1 redundant power supply configuration, is faulty during power up. Each redundant power supply configuration can include an Oring-FET and a voltage comparator. The voltage comparator can receive an input voltage of the Oring-FET and an output of the Oring-FET and can compare the two voltages. In the event input voltage is less than the output voltage during power up, the Oring-FET can be deemed to be operating properly and provide power to a communicatively coupled system bus in response to the input voltage reaching a predetermined voltage threshold level. In the event the input voltage is approximately equal to the output voltage during power up, the voltage comparator can assist in preventing inrush current from flowing from the communicatively coupled system bus and prevents voltage sagging on the communicatively coupled system bus when another redundant power supply is providing power to the system.

Figure 1:
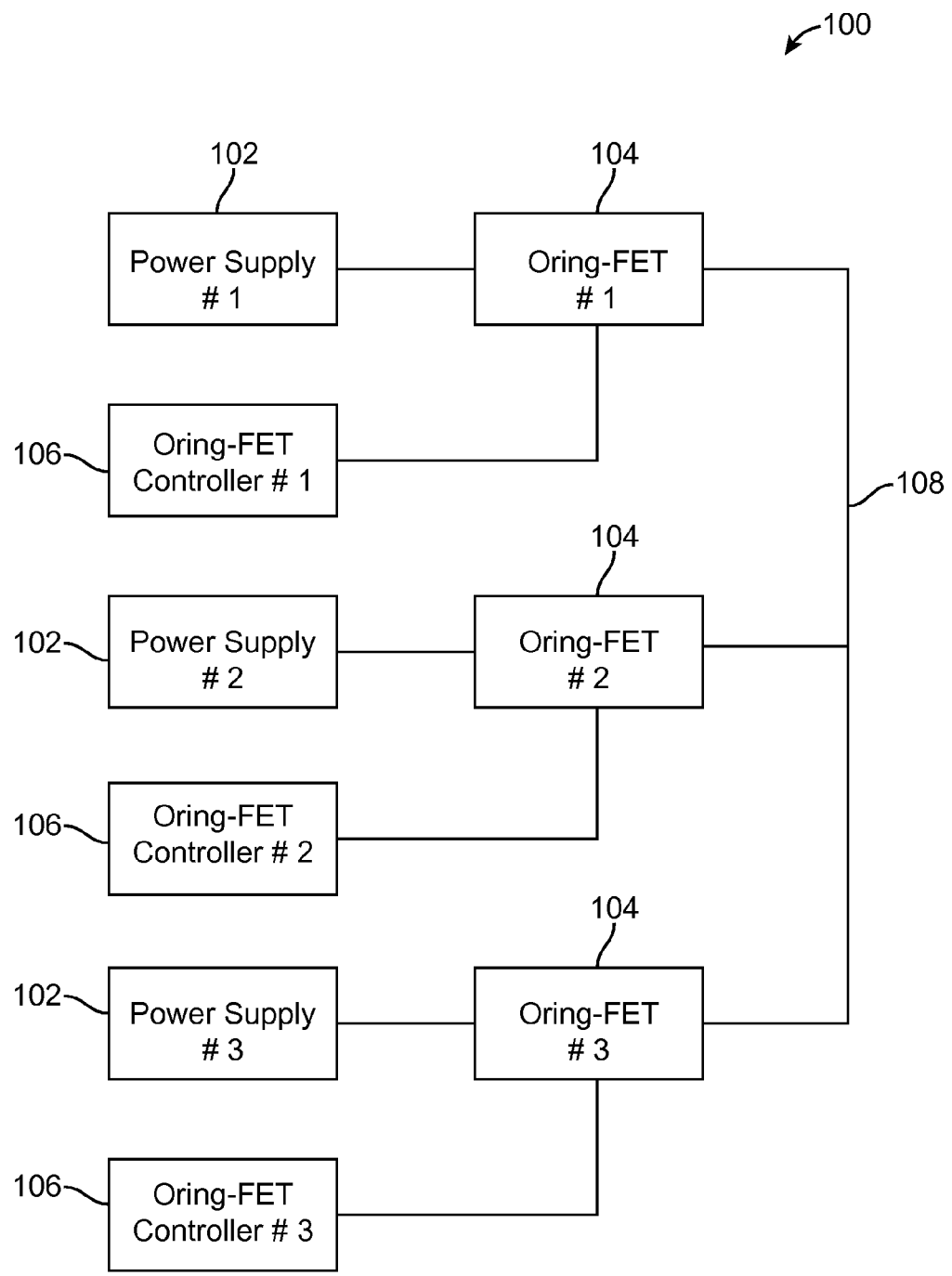
FIG. 1 is a simplified block diagram of a basic N+1 redundant power supply configuration in accordance with an exemplary embodiment.
Figure 2:
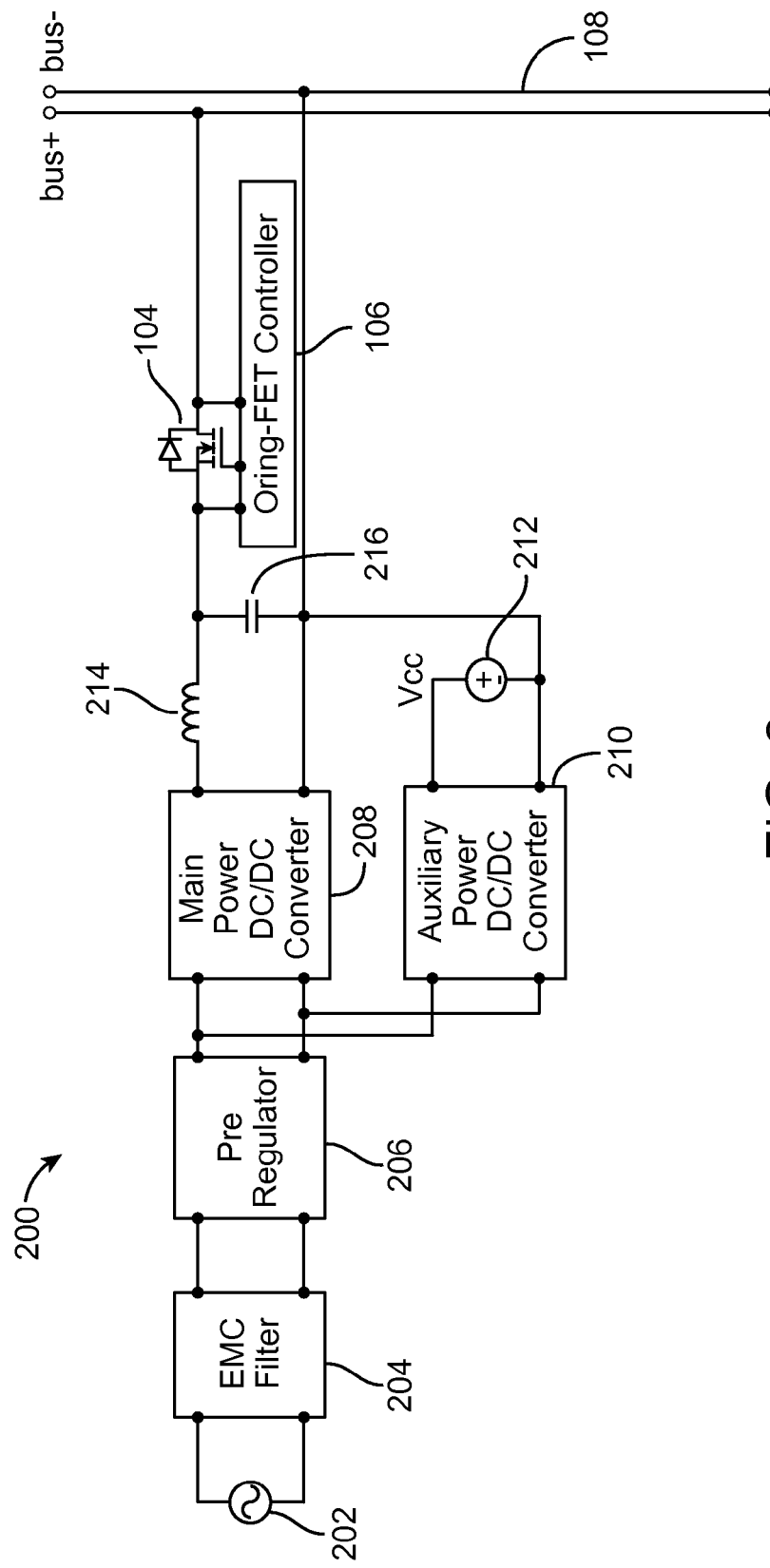
FIG. 2 illustrates a detailed block diagram of a power supply configuration for a redundant power supply configuration in accordance with an exemplary embodiment
Figure 3:
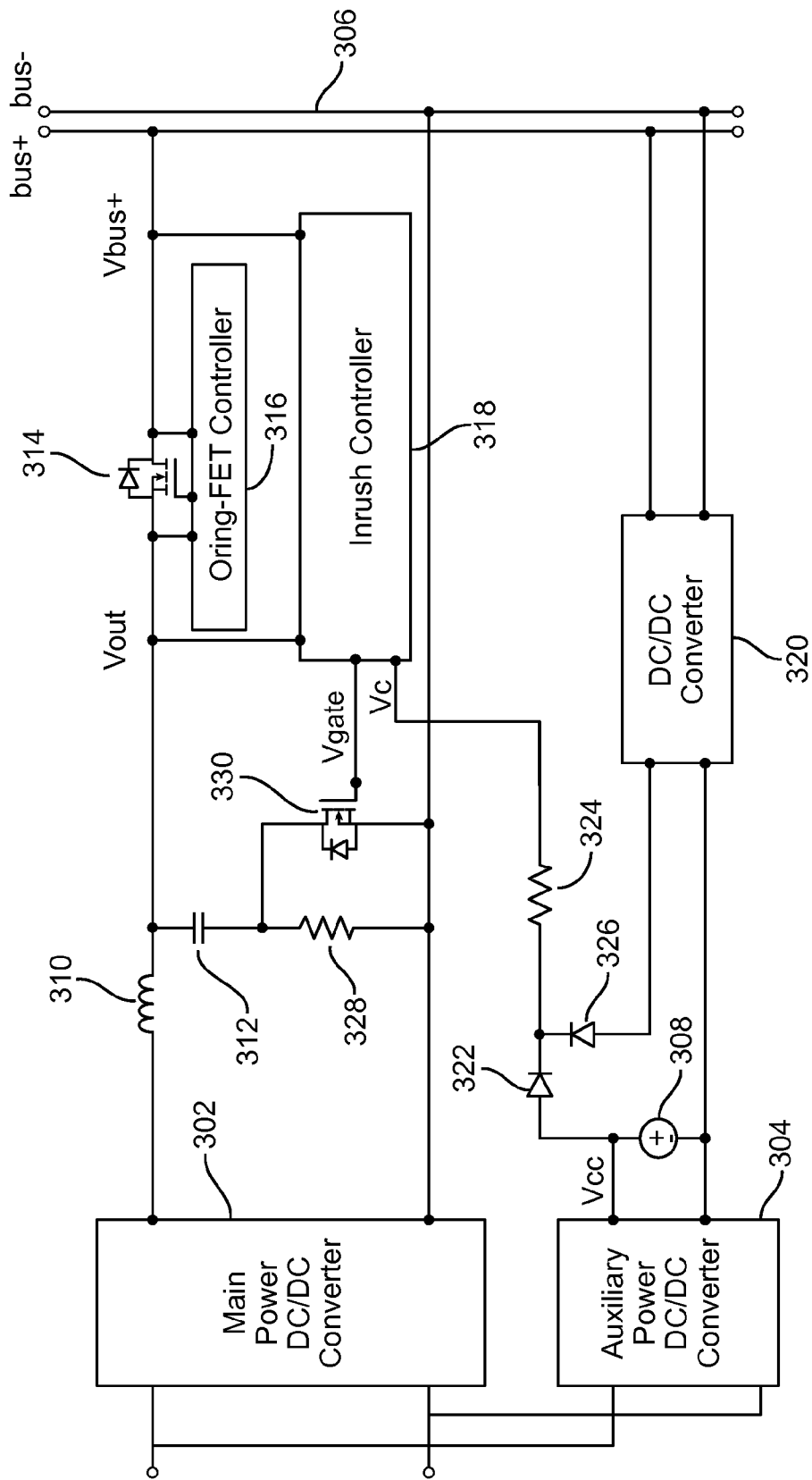
FIG. 3 illustrates a block diagram of a power supply configuration for reducing or preventing voltage sag during power up in accordance with an exemplary embodiment.
Figure 4:
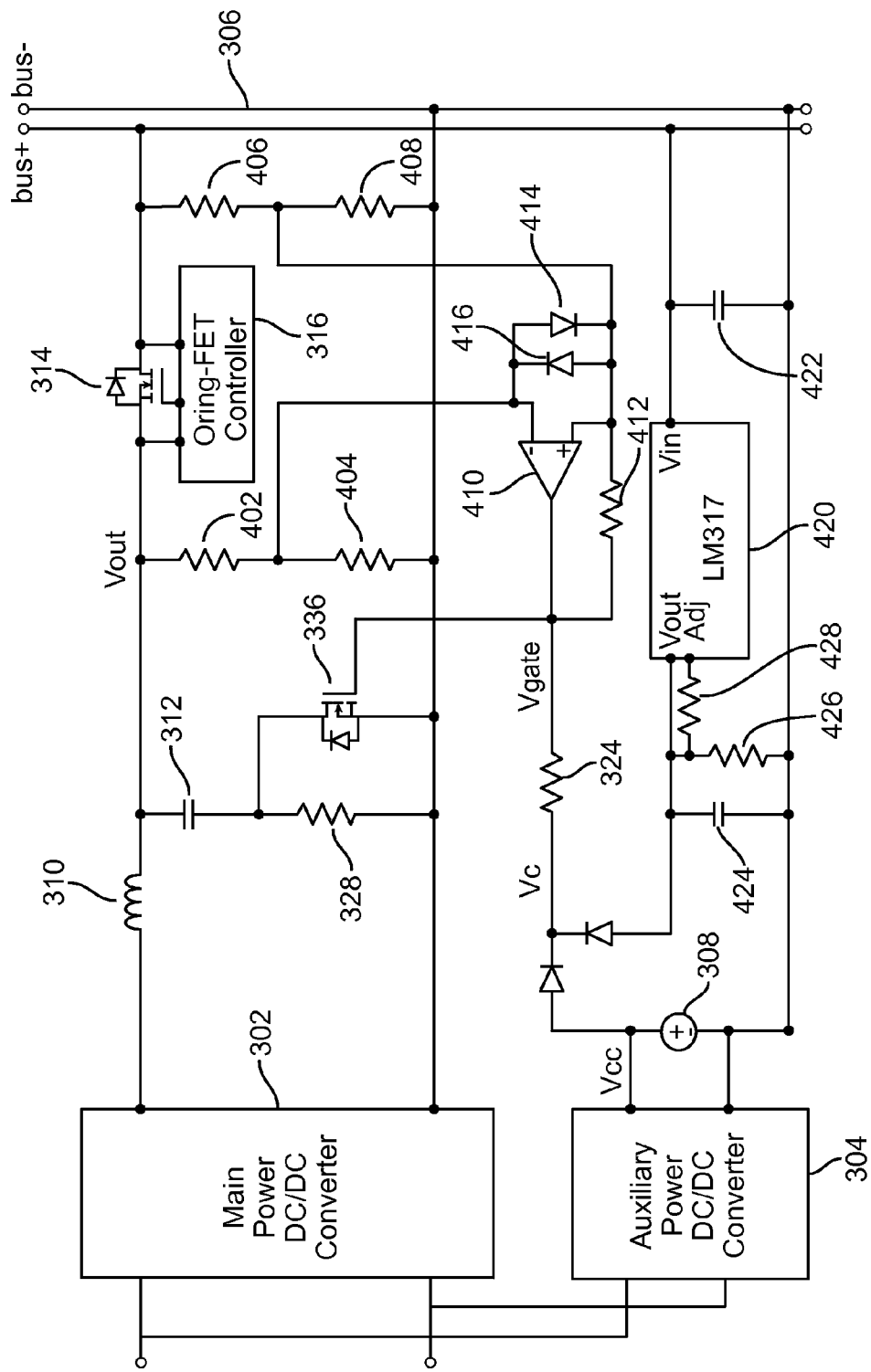
FIG. 4 illustrates a detailed block diagram of a power supply configuration for reducing or preventing voltage sag during power up in accordance with an exemplary embodiment.

Referring to FIGS. 3 and 4, block diagrams of a power supply circuitry for reducing and/or preventing voltage sagging in an N+1 redundant power supply configuration during power up in accordance with exemplary embodiments are illustrated. FIG. 4 is a more detailed block diagram of the block diagram of FIG. 3. Although not shown, the power supply configurations of FIGS. 3 and 4 can include the power supply 202, EMC filter 204 and pre-regulator 206 described above in association with FIG. 2, as well as more or less components. As shown in FIGS. 3 and 4, a main DC/DC converter or main power DC/DC converter 302 and an auxiliary DC/DC converter or auxiliary power DC/DC converter 304 can be communicatively coupled to a system bus 306. The auxiliary DC/DC converter 304 and an auxiliary power supply 308 can provide housekeeping service during power up, initialization and normal operation. The main DC/DC converter 208 can convert the regulated power from the pre-regulator 206 from a first voltage to a second voltage, different from the first voltage. The output voltage can be provided to the system bus 306 in response to the input voltage reaching the predetermined voltage threshold level. The predetermined voltage threshold can be the voltage level of the system bus plus the voltage loss associated with the Oring-FET, such as 0.7 volts. In one or more embodiments, the main DC/DC converter 302 can generate a 12 volt output. In one or more embodiments, the main DC/DC converter 302 can generate other suitable voltages.

The output of the main DC/DC converter 302 can flow through a filter which can comprise an inductor 310 and capacitor 312. The filter can reduce noise from the output of the DC/DC converter 208. The filtered power supply voltage $V_{out}$ can flow to an Oring-FET 104. When the Oring-FET 314 is powered and operating properly, the Oring-FET 314 can serve as a diode to pass the filtered power supply voltage $V_{out}$ to the system bus 306. When the Oring-FET 314 is operating properly, the Oring-FET 314 can assist and/or prevent current passing through the Oring-FET 314 from the system bus 306. An Oring-FET controller 316 can control the Oring-FET 314 when the Oring-FET 314 is operating properly.

As shown in FIGS. 3 and 4, an overcurrent resistor 328 can be in series with the capacitor 312 and an overcurrent Oring-FET 330 can be in parallel with the overcurrent resistor 328. In the event, the Oring-FET 314 is shorted due to the Oring-FET 314 being faulty, the overcurrent resistor 328 can limit reverse charging current from flowing through to the uncharged the capacitor 312 during power up and/or initialization. As a result, the overcurrent resistor 328 can reduce or prevent the voltage sagging on the system bus 306 thereby preventing an undesirable system reboot. As explained below, the value of the overcurrent resistor 328 can be selected to prevent triggering of overcurrent protection on the other power supplies communicatively coupled to the system bus 306 in a redundant power supply configuration.

As shown in FIG. 3, an inrush controller 318 can control the overcurrent Oring-FET 330. The inrush controller 318 can determine whether the Oring-FET 314 is working properly. Specifically, the inrush controller 318 can compare the input voltage flowing into an input of the Oring-FET 314 (for example, the voltage ($V_{out}$) associated with a communicatively coupled power supply 102) with the voltage flowing out of an output of the Oring-FET 314 (for example, the voltage being provided to a communicatively coupled system bus 308). When a power supply is plugged into the power supply configuration 300 and the Oring-FET 314 is operating properly, the input voltage of the Oring-FET 314 will be less than the output voltage of the Oring-FET 314 during power up. In response to the input voltage of the Oring-FET 314 being less than the output voltage of the Oring-FET 314, the inrush controller 318 can cause the overcurrent Oring-FET 330 to be turned on. Specifically, the inrush controller 318 can cause the $V_{gate}$ of the overcurrent Oring-FET 330 to be high causing the overcurrent resistor 328 to be shorted. In response to the input voltage of the Oring-FET 314 being approximately equal to the output voltage of the Oring-FET 314, the inrush controller 318 can cause the overcurrent Oring-FET 330 to be off Specifically, the overcurrent Oring-FET 330 can cause the $V_{gate}$ of the overcurrent Oring-FET 330 to be low causing the overcurrent resistor 328 to be active and assist or prevent inrush current from flowing through to the uncharged capacitor 312 during power up. When $V_{gate}$ is low, the main DC/DC converter 302 is turned off and no output voltage will pass to the system bus 306.

In the event the power supply of the power supply configuration 300 is active, auxiliary DC/DC converter 304 can provide power to the inrush controller 318. A diode 322 and a resistor 324 can be in series with the output of the auxiliary DC/DC converter 304 to assist in preventing reverse current from being passed to the auxiliary DC/DC converter 304. In the event the power supply of the power supply configuration 300 is inactive, a power bus DC/DC converter 320 can provide power to the inrush controller 318. The power bus DC/DC controller 320 can regulate the voltage from the system bus 306. A diode 326 and a resistor 324 can be in series with the output of the power bus DC/DC converter 320 to assist in preventing reverse current from being passed to the power bus DC/DC converter 320. For example, the system bus 306 can power the power bus DC/DC converter 320 which can provide a regulated voltage to the inrush controller 318.

The following describes how a suitable overcurrent resistor 328 can be chosen. Assuming that the main DC/DC converter 302 provides an output voltage V and output power P. Then the output current I is equal to output power P divided by output power V (P/V). Then overcurrent resistor 328 can be selected to limit the extra current to be 0.01% of the current I. Therefore, overcurrent resistor 328 can be equal to the output voltage divided by 0.0001 of the current I (R=V/(0.0001I)). The power rating of overcurrent resistor 328 can be $0.5(V^2/R)$. For example, if the output power from the main DC/DC converter 302 has an output power of 1000 watts and an output voltage of 12 volts, then:

I=1000/12=83.33 amperes

R1=12/(0.0001×83.33)=1440 ohms

The power rating of the overcurrent resistor 328 can be 0.5×144/1440=0.05 watts. Therefore, a small 1206 package resistor can be the minimum value for the overcurrent resistor 328.

For the overcurrent Oring-FET 330, the voltage rating can be 120% of the bus voltage ($V_{bus}$) and the current rating can be able to handle rippled current through capacitor 312 during normal operation. For example, if the output power from the main DC/DC converter 302 has an output power of 100 watts and an output voltage of 12 volts, then:

$V_{ds}$ of the overcurrent Oring-FET 330=1.2× 12V=14.4 volts $I_{ds}$ of the overcurrent Oring-FET 330=0.2×1000/ 12=16.6 amps Therefor a Fairchild Semiconductor FDD6530A MOSFET (20V 21A) can be used in the power supply configuration 300, 400.

Referring to FIG. 4, a detailed block diagram of a power supply configuration for reducing or preventing voltage sag in accordance with an exemplary embodiment is illustrated. As shown, the inrush controller 318 of FIG. 3 is replaced with a plurality of components including a voltage comparator 410. Although the plurality of components shown in FIG. 4 is one specific configuration, it is by no means the only configuration which can be implemented. As shown, the plurality of components can include a first voltage divider comprising a first resistor 402 and a second resistor 404, a second voltage divider comprising a first resistor 406 and a second resistor 408, a voltage comparator 410, a feedback resistor 410, a first diode 412 and a second diode 414.

As shown, a voltage comparator 410 can determine whether the Oring-FET 314 is working properly during power up by comparing the voltage flowing into an input of the Oring-FET 314 and the voltage flowing out of an output of the Oring-FET 314. To protect the voltage comparator 410, a first voltage divider and a second voltage divider can be used to reduce the voltages flowing into the voltage comparator 410. The first voltage divider can comprise a first resistor 402 and a second resistor 404. The second voltage divider can comprise a first resistor 406 and a second resistor 408. The first resistor 402 of the first voltage divider and the first resistor 406 of the second voltage divider can have the same resistance. The second resistor 404 of the first voltage divider and the second resistor 408 of the second voltage divider can have the same resistance. When an active power supply is communicatively coupled to the power supply configuration 300 and the Oring-FET 314 is operating properly, the input voltage of the Oring-FET 314 (for example, the voltage from the first voltage divider) will be less than the output voltage of the Oring-FET 314 (for example, the voltage from the second voltage divider) during power up. In response to the input voltage of the Oring-FET 314 (for example, the voltage from the first voltage divider) being less than the output voltage of the Oring-FET 314 (for example, the voltage from the second voltage divider), the voltage comparator 410 can cause the overcurrent Oring-FET 330 to be turned on. Specifically, the voltage comparator 410 can cause the $V_{gate}$ of the overcurrent Oring-FET 330 to be high causing the overcurrent resistor 328 to be shorted. In response to the input voltage of the Oring-FET 314 (for example, the voltage from the first voltage divider) being approximately equal to the output voltage of the Oring-FET 314 (for example, the voltage from the second voltage divider) during power up, the voltage comparator 410 can cause the overcurrent Oring-FET 330 to be off. Specifically, the voltage comparator 410 can cause the $V_{gate}$ of the overcurrent Oring-FET 330 to be low causing the overcurrent resistor 328 to be active and preventing inrush current from flowing to the uncharged capacitor 312 during power up. When $V_{gate}$ is low, the main DC/DC converter 302 is prevented from turning on and no output voltage will pass to the system bus 306.

A first diode 416 and a second diode 418 can serve as a clamp voltage source to prevent damage to the voltage comparator 410. The fifth resistor 410 can be a positive feedback resistor for the voltage comparator 410 to ensure that Oring-FET 314 is turning on when $V_{out}$ starts to ramp up after the power supply is installed into the power supply configuration 300, 400. When $V_{gate}$ is low, this signal passes to the main DC/DC converter 302, preventing the main DC/DC converter 302 from turning on.

When the Oring-FET 314 is operating properly during power up, a feedback resistor 412 can be a positive feedback resistor for the voltage comparator 410 to ensure that Oring-FET 314 is turning on when $V_{out}$ starts to ramp up after the power supply is installed into the power supply configuration 400. A first diode 414 and a second diode 416 can serve as a clamp voltage source to prevent damage to the voltage comparator 410.

As shown in FIG. 4, the power bus DC/DC converter 320 of FIG. 3 is replaced with a low dropout (LDO) voltage regulator 420. In one or more embodiments, the LDO voltage regulator 420 can be a LM317 voltage regulator. In the event the power supply of the power supply configuration 400 is inactive, the LDO voltage regulator 420 can provide power to the voltage comparator 410. The LDO voltage regulator 420 can regulate the voltage from the system bus 306. An input filter 412, such as a capacitor, can filter the input of the LDO voltage regulator 420. Resistors 426, 428 can set the output voltage of the LDO voltage regulator 420. An output filter 414, such as a capacitor, can filter the output of the LDO voltage regulator 420.

Figure 5:
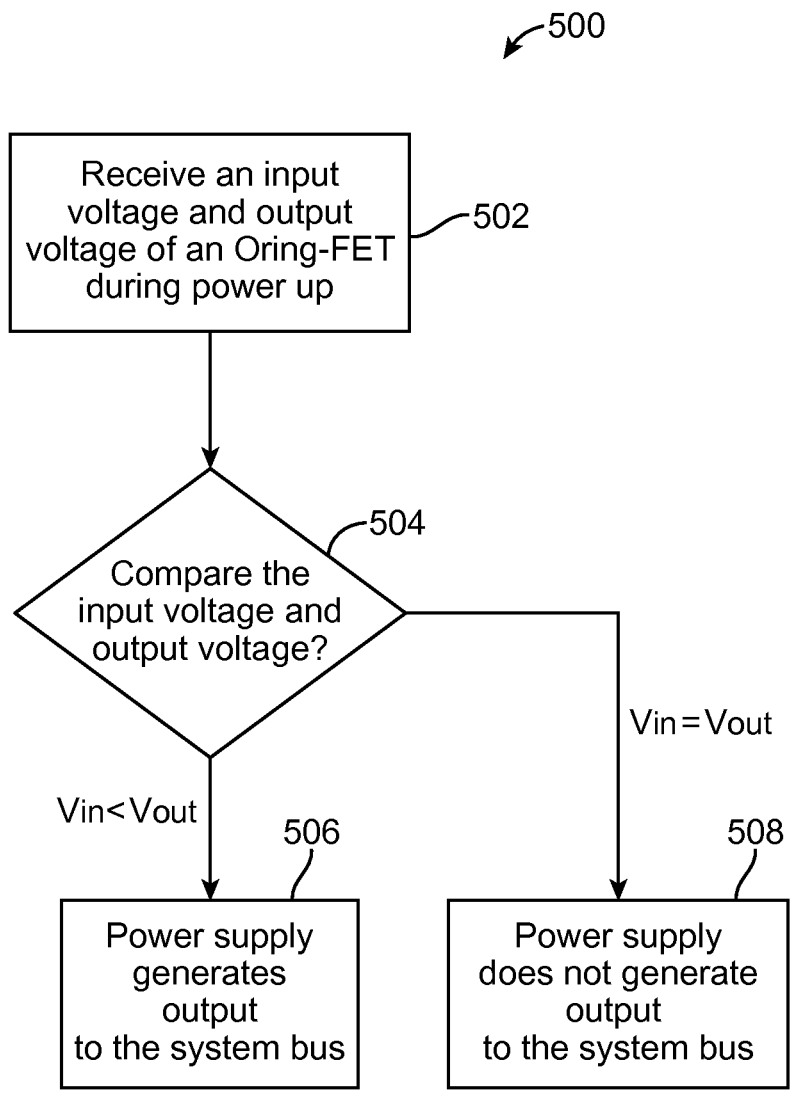
FIG. 5 illustrates a flowchart of a method for determining the operability of an Oring-FET within a power supply configuration of an N+1 redundant power supply configuration during power up in accordance with an exemplary embodiment is illustrated.

Referring to FIG. 5, a flowchart of a method for determining the operability of an Oring-FET within a power supply configuration of a 1+N redundant power supply configuration in accordance with an exemplary embodiment is illustrated. The exemplary method 500 is provided by way of example, as there are a variety of ways to carry out the method. The method 500 described below can be carried out using the configurations illustrated in FIGS. 3 and 4 by way of example, and various elements of these figures are referenced in explaining exemplary method 500. Each block shown in FIG. 5 represents one or more processes, methods or subroutines, carried out in the exemplary method 500. The exemplary method 500 can begin at block 502.

At block 502, receive an input voltage and an output voltage of an Oring-FET. For example, the inrush controller 318 can receive the input voltage of the Oring-FET 314 and can receive the output voltage of the Oring-FET 314. In another example, the voltage comparator 410 can receive the input voltage of the Oring-FET 314, such as the voltage from the first voltage divider, and can receive the output voltage of the Oring-FET 314, such as the voltage from the second voltage divider. Receiving the first and second voltages can occur in response to the power supply of the power supply configuration 300, 400 being powered up. After receiving the first voltage and second voltage, the method 500 can proceed to block 504.

At block 504, compare the input voltage and output voltage. For example, the inrush controller 318 or a voltage comparator 410 compares the input voltage with the output voltage of the Oring-FET 314. The comparison determines whether the Oring-FET 314 in the power supply configuration 300, 400 is operating properly during power up. In the event, the input voltage of the Oring-FET 314 is less than the output voltage of the Oring-FET 314 during power up, then the Oring-FET 314 is operating properly and the method 500 proceeds to block 506. In the event, the input voltage of the Oring-FET 314 is approximately equal to the output voltage of the Oring-FET 314 during power up, then the Oring-FET 314 is not operating properly and the method 500 proceeds to block 508.

At block 506, generate output to the system bus. For example, in the event the power supply of the power supply configuration 300, 400 is powered up, the inrush controller 318 or the voltage comparator 410 drives the $V_{gate}$ of the overcurrent Oring-FET 330 high in response to Oring-FET 314 being determined to be operating properly. The overcurrent Oring-FET 330 is turned on in response to the $V_{gate}$ being driven high. The overcurrent resistor 328 is shorted out in response to the overcurrent Oring-FET 330 being turned on. The power supply communicatively coupled to the main DC/DC converter 302 can provide power to the system bus 308 in response to the overcurrent resistor 328 being shorted and the input voltage of the Oring-FET 314 reaching a predetermined voltage threshold level. The method 500 can continue to block 502.

In the event the power supply of the power supply configuration 300, 400 is already on, then the inrush controller 318 or the voltage comparator 410 maintains the $V_{gate}$ of the overcurrent Oring-FET 330 high in response to Oring-FET 314 being determined to be operating properly. In addition, the overcurrent Oring-FET 330 stays on in response to the $V_{gate}$, the overcurrent resistor 328 continues to be shorted, and the power supply communicatively coupled to the main DC/DC converter 302 continues to provide power to the system bus 308.

At block 508, the power supply does not provide power to the system bus. For example, in the event the power supply of the power supply configuration 300, 400 is powered up, the inrush controller 318 or the voltage comparator 410 drives the $V_{gate}$ of the overcurrent Oring-FET 330 low in response to Oring-FET 314 being determined to not be operating properly. The overcurrent Oring-FET 330 maintains being off in response to the $V_{gate}$ being low. The overcurrent resistor 328 assists or prevents inrush current being passed to the uncharged capacitor 312 in response to the overcurrent Oring-FET 330 staying off. The main DC/DC converter 302 is turned off preventing power to the system bus 308 and the overcurrent resistor 328 assists or prevents inrush current being passed to the capacitor 312. By assisting or preventing inrush current from being passed to the uncharged capacitor 312 during power up, a voltage sag on the system bus 306 can be prevented, thereby preventing an undesirable system reboot.

In the event the power supply of the power supply configuration 300, 400 is already on, then the inrush controller 318 or the voltage comparator 410 drives the $V_{gate}$ of the overcurrent Oring-FET 330 low in response to Oring-FET 314 being determined to be not operating properly during power up. In addition, the overcurrent Oring-FET 330 stays off in response to the $V_{gate}$, the overcurrent resistor 328 continues to assist or prevent inrush current being pass to the uncharged capacitor 312, and the power supply communicatively coupled to the main DC/DC converter 302 does not provide power to the system bus 308. By assisting or preventing inrush current from being passed to the uncharged capacitor 312 during power up, a voltage sag on the system bus 306 can be prevented, thereby preventing an undesirable system reboot.

Although a variety of examples and other information was used to explain aspects within the scope of the appended claims, no limitation of the claims should be implied based on particular features or arrangements in such examples, as one of ordinary skill would be able to use these examples to derive a wide variety of implementations. Further and although some subject matter may have been described in language specific to examples of structural features and/or method steps, it is to be understood that the subject matter defined in the appended claims is not necessarily limited to these described features or acts. For example, such functionality can be distributed differently or performed in components other than those identified herein. Rather, the described features and steps are disclosed as examples of components of systems and methods within the scope of the appended claims.

The invention claimed is:

1. A method comprising:
receiving, by a voltage comparator, an input voltage of an Oring-FET and an output voltage of the Oring-FET with the Oring-FET being in a redundant power supply configuration;
comparing the input voltage and the output voltage, wherein comparing the input voltage and the output voltage determines whether the Oring-FET is faulty during power up;
in the event the input voltage is less than the output voltage during power up, the Oring-FET provides output to a communicatively coupled system bus; and
in the event the input voltage is approximately equal to the output voltage during power up, the voltage comparator assists in preventing inrush current from flowing from the communicatively coupled system bus when another redundant power supply configuration is providing power to the communicatively coupled system bus.

2. The method of claim 1 wherein provides output to a communicatively coupled system bus further comprises:
driving high a Vgate of a communicatively coupled overcurrent Oring-FET;
causing the overcurrent Oring-FET to be in series with a capacitor communicatively coupled with a redundant power supply in response to the Vgate being high; and
providing power from the communicatively coupled power supply to the system bus in response to the overcurrent Oring-FET being in series with the capacitor and the input voltage reaching a predetermined voltage threshold level.

3. The method of claim 2 wherein in the event the overcurrent Oring-FET is in an off state, turning on the overcurrent Oring-FET in response to the Vgate being high.

4. The method of claim 2 wherein in the event the overcurrent Oring-FET is in an on state, maintaining the overcurrent Oring-FET being on in response to the Vgate being high.

5. The method of claim 1 wherein receiving the input voltage further comprises passing the input voltage through a first voltage divider and receiving the output voltage further comprises passing the output voltage through a second voltage divider and wherein comparing the input voltage and output voltage further comprises comparing the voltage from the first voltage divider and comparing the voltage from the second voltage divider.

6. The method of claim 1 wherein assisting in preventing inrush current from flowing from the communicatively coupled system bus further comprises:
   driving low a Vgate of a communicatively coupled overcurrent Oring-FET;
   causing an overcurrent resistor to be in series with a capacitor communicatively coupled to a redundant power supply in response to the Vgate being low; and
   preventing power from the communicatively coupled power supply from flowing to the system bus in response to the overcurrent resistor being in series with the capacitor.

7. The method of claim 6 further comprising assisting in preventing a voltage sag on the system bus in response to the overcurrent resistor being in series with the capacitor.

8. The method of claim 6 wherein in the event the overcurrent Oring-FET is in an off state, maintaining the overcurrent Oring-FET being off in response to the Vgate being low.

9. The method of claim 6 wherein in the event the overcurrent Oring-FET is in an on state, turning off the overcurrent Oring-FET in response to the Vgate being low.

10. A system comprising an N+1 redundant power configuration with each power configuration comprising:
    a voltage comparator configured to:
       receive an input voltage of an Oring-FET and an output of the Oring-FET with the Oring-FET being in the redundant power supply configuration; and
       compare the input voltage and the output voltage to determine whether the Oring-FET is faulty during power up; and
    an overcurrent Oring-FET with a Vgate of the overcurrent Oring-FET communicatively coupled to the voltage comparator with the overcurrent Oring-FET configured to:
    cause the Oring-FET to provide output to a communicatively coupled system bus in the event the input voltage is less than the output voltage during power up; and
    assist in preventing inrush current from flowing from the communicatively coupled system bus in the event the input voltage is approximately equal to the output voltage during power when another redundant power supply configuration is providing power to the communicatively coupled system bus.

11. The system of claim 10 further comprising:
    a capacitor in series with an output of the overcurrent Oring-FET and communicatively coupled to a redundant power supply; and
    an overcurrent resistor in parallel with the overcurrent Oring-FET and in series with the capacitor
    wherein in the event a Vgate of the overcurrent Oring-FET is high, the overcurrent Oring-FET causes the overcurrent resistor to be shorted and causes the capacitor to allow power from the power supply to be supplied to a system bus communicatively coupled to the output of the Oring-FET in response to the input voltage reaching a predetermined voltage threshold level.

12. The system of claim 11 wherein in the event the overcurrent Oring-FET is in an off state, turning on the overcurrent Oring-FET in response to the Vgate being high.

13. The system of claim 11 wherein in the event the overcurrent Oring-FET is in an on state, maintaining the overcurrent Oring-FET being on in response to the Vgate being high.

14. The system of claim 10 further comprising:
    a first voltage divider communicatively coupled to the input of the Oring-FET and providing a divided input voltage to an input of the Oring-FET;
    a second voltage divider communicatively coupled to the output of the Oring-FET and providing a divided output voltage to an input of the Oring-FET;
    wherein the Oring-FET compares divided input voltage and the divided output voltage.

15. The system of claim 10 further comprising:
    a capacitor in series with an output of the overcurrent Oring-FET and communicatively coupled to a redundant power supply; and
    an overcurrent resistor in parallel with the overcurrent Oring-FET and in series with the capacitor, and
    wherein in the event a Vgate of the overcurrent Oring-FET is low, the overcurrent resistor prevents power from the power supply from flowing to the system bus.

16. The system of claim 15 wherein the overcurrent resistor further assist in preventing a voltage sag on the system bus in response to the Vgate of the overcurrent Oring-FET being low.

17. The system of claim 10 wherein in the event the overcurrent Oring-FET is in an off state, the overcurrent Oring-FET maintains being off in response to the Vgate being low.

18. The system of claim 10 wherein in the event the overcurrent Oring-FET is in an on state, the overcurrent Oring-FET is turned off in response to the Vgate being low.

* * * * *